United States Patent
Yamazaki et al.

(10) Patent No.: US 7,585,385 B2
(45) Date of Patent: Sep. 8, 2009

(54) PLASMA PROCESSING APPARATUS, CONTROL METHOD THEREOF AND PROGRAM FOR PERFORMING SAME

(75) Inventors: Satoshi Yamazaki, Nirasaki (JP); Taira Takase, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 346 days.

(21) Appl. No.: 11/176,375

(22) Filed: Jul. 8, 2005

(65) Prior Publication Data

US 2006/0005927 A1     Jan. 12, 2006

Related U.S. Application Data

(60) Provisional application No. 60/598,426, filed on Aug. 4, 2004.

(30) Foreign Application Priority Data

Jul. 8, 2004     (JP) ............... 2004-202082

(51) Int. Cl.
  *C23C 16/00*   (2006.01)
  *C23F 1/00*    (2006.01)
  *H01L 21/306*  (2006.01)

(52) U.S. Cl. .................. 156/345.46; 156/345.24; 156/345.28; 156/345.42; 156/345.49; 118/723 MR; 118/723 MA

(58) Field of Classification Search ............ 156/345.46, 156/345.24, 345.28; 118/723 MR, 723 MA
See application file for complete search history.

(56) References Cited

U.S. PATENT DOCUMENTS

| | | | | |
|---|---|---|---|---|
| 4,600,492 A | * | 7/1986 | Ooshio et al. | 204/298.2 |
| 4,643,629 A | * | 2/1987 | Takahashi et al. | 414/331.17 |
| 5,236,556 A | * | 8/1993 | Yokota et al. | 204/298.32 |
| 5,762,766 A | * | 6/1998 | Kurita et al. | 204/192.2 |
| 6,351,075 B1 | * | 2/2002 | Barankova et al. | 315/111.71 |
| 6,436,230 B1 | * | 8/2002 | Kondo et al. | 156/345.46 |
| 6,602,347 B1 | * | 8/2003 | Shimoda et al. | 118/718 |

FOREIGN PATENT DOCUMENTS

JP       07-130495       5/1995

* cited by examiner

*Primary Examiner*—Parviz Hassanzadeh
*Assistant Examiner*—Rakesh K Dhingra
(74) *Attorney, Agent, or Firm*—Oblon, Spivak, McClelland, Maier & Neustadt, P.C.

(57) ABSTRACT

A plasma processing apparatus includes a processing chamber for accommodating therein an object to be processed, a plurality of bar-shaped magnets rotatably installed standing around the processing chamber, a rotation driving mechanism for synchronously rotating the bar-shaped magnets, a rotation detection unit for detecting a rotation of a bar-shaped magnet and clocking times corresponding to the detected rotation, and an abnormal rotation determination unit for determining whether the rotation driving mechanism is abnormal by comparing an interval calculated from the clocked times to a time period.

15 Claims, 9 Drawing Sheets

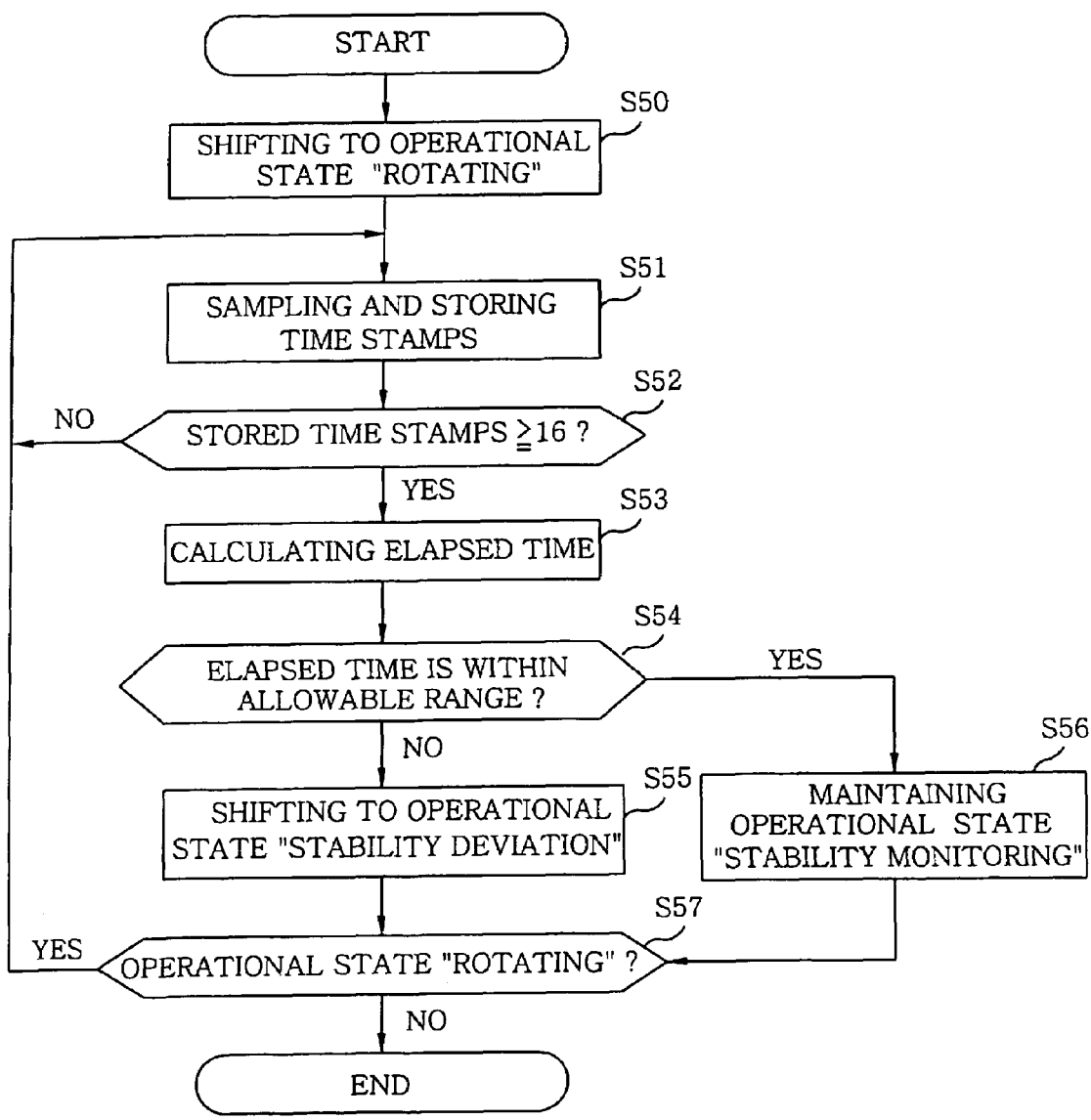

FIG. 6

| MACHINE LOG | TELECC | 000 | IDLE | SLOT STATES | APPARATUS STATES | 2002/12/16 16:37:36 |
|---|---|---|---|---|---|---|

MACHINE LOG

SELECT NO./TOTAL SEARCHES  1/100

| DATE | TIME | SUMMARY | | | |
|---|---|---|---|---|---|
| 12/16 | 16:33:09 | [MC | -0002] PROC | P2 at PRC detect time 53,4,54,54,53,57,53,53 | |
| 12/16 | 16:33:09 | [MC | -0002] PROC | P2:Magnet Speed 8[rpm],WarningPoint 9/16 | |
| 12/16 | 16:30:16 | [MML_SYST | -0002] MMI | P2 Mainteance Switched | |
| 12/16 | 16:21:21 | [MC | -0002] WAF | [V340R206-06/12][Waf:250/Bug_Fix PlorP2 P | |
| 12/16 | 16:21:20 | [MMICMN | -0002] MMI | Operation type or operator change (5 TELE... | |
| 12/16 | 16:20:35 | [M/C | -0002] APC | P2:CM Torr Mode | |
| 12/16 | 16:20:35 | [M/C | -0002] APC | P1:CM Torr Mode | |
| 12/16 | 16:20:35 | [M/C | -0002] INIT | P1 INT Reg Send to PCSEQ task (INIT - - -> P | |
| 12/16 | 16:20:35 | [M/C | -0002] INIT | P2 INT Reg Send to PCSEQ task (INIT - - -> P | |
| 12/16 | 16:19:28 | [M/C | -0002] PROC | P2:RF-RFF 500[msec] Fix Type | |
| 12/16 | 16:19:27 | [M/C | -0002] PROC | P1:RF-RFF 500[msec] Fix Type | |
| 12/16 | 16:17:37 | [COMMAND | -0002] MMI | Equipment has started. | |
| 12/16 | 16:15:16 | [MMICMN | -0002] MMI | Going to shutdown | |
| 12/16 | 16:11:10 | [MMICMN | -0002] MMI | Operation type or operator change (5 TELE... | |

| END | SEARCH KEY | NEXT SEARCH | PREVIOUS SEARCH | DETAIL | FD STORE | FD FORMAT | 16 |
|---|---|---|---|---|---|---|---|

PLASMA PROCESSING APPARATUS, CONTROL METHOD THEREOF AND PROGRAM FOR PERFORMING SAME

CROSS-REFERENCE TO RELATED APPLICATIONS

This document claims priority to Japanese Patent Application Number 2004-202082, filed Jul. 8, 2004 and U.S. Provisional Application No. 60/598,426, filed Aug. 4, 2004, the entire content of which are hereby incorporated by reference.

FIELD OF THE INVENTION

The present invention relates to a plasma processing apparatus, a control method thereof and a program for performing the method; and, more particularly, a plasma processing apparatus including a processing chamber surrounded by a plurality of cylindrical magnets, a control method thereof and a program for performing the method.

BACKGROUND OF THE INVENTION

Conventionally, a DRM (Dipole Ring Magnet) type plasma processing apparatus has been utilized as an apparatus for performing a plasma process such as a film forming or etching process on a semiconductor wafer. The DRM type plasma processing apparatus includes a processing chamber for accommodating a semiconductor wafer therein and a plurality of cylindrical magnets that are arranged upright in a loop around the processing chamber. Each magnet is paired with another magnet which is arranged to have point symmetry about the central axis of the chamber with respect to each other. The magnets are connected to a rotation driving mechanism such that they all rotate synchronously. When each magnet (segment magnet) is rotated by 180 degrees, the magnetization direction makes one revolution (reversed). Further, in the DRM type plasma processing apparatus, a plurality of the cylindrical magnets are synchronously rotated to produce a horizontal magnetic field in the processing chamber, whereby a plasma process is performed on a semiconductor wafer which is horizontally disposed on a mounting table in the processing chamber (for example, see Reference 1). Such a DRM type plasma processing apparatus is appropriate for producing a unidirectional magnetic field in a large space. Further, compared to a plasma processing apparatus using a superconducting coil or a resistive coil, the DRM type plasma processing apparatus is relatively maintenance-free and easy to control the uniformity and directionality (skew angle) of a produced magnetic field. Therefore, it has been utilized as an external magnetic field producing unit in various semiconductor manufacturing processes.

The rotation driving mechanism has a motor, and the rotational power of the motor is transferred to respective cylindrical magnets to rotate them. In the DRM type plasma processing apparatus, the plurality of cylindrical magnets need to be rotated precisely to ensure a proper plasma processing on a semiconductor wafer. Accordingly, a conventional DRM type plasma processing apparatus includes a rotation detection unit (trigger sensor) that generates a rotation alarm when the detection unit is unable to detect any rotation of the cylindrical magnets. Also included is a motor abnormality detection unit that generates a motor alarm when any abnormality in the motor has been detected.

[Reference 1] Japanese Patent Laid-open Publication No. H7-130495

However, for example, even if the cylindrical magnets can be rotated, if their rotational velocity is not stable due to breakdown, wear and tear etc. of the rotation driving mechanism, the magnetic field produced on the semiconductor wafer in the processing chamber will become nonuniform. As a result, the plasma process cannot be performed stably on the surface of the semiconductor wafer. Ultimately, the overall in-surface uniformity of the plasma processing cannot be guaranteed; for example, on the surface of a single semiconductor wafer, spots in OPEN condition (excessive etching) and SHORT condition (insufficient etching) will result during etch processing.

Generally speaking, the maintenance cycle of a driving mechanism needs to be shortened to avoid its breakdowns and wear and tear, but such measures will compromise the steady and continuous operation of the DRM type plasma processing apparatus.

SUMMARY OF THE INVENTION

It is, therefore, an object of the present invention to provide a plasma processing apparatus capable of assuring the in-surface uniformity of plasma processing without compromising the steady and continuous operation of the plasma processing apparatus, a control method thereof and a program for performing the method.

In accordance with a first aspect of the present invention, there is provided a plasma processing apparatus including a processing chamber for accommodating therein an object to be processed; a plurality of bar-shaped magnets rotatably installed standing around the processing chamber; a rotation driving mechanism for synchronously rotating the bar-shaped magnets; a rotation detection unit for detecting a rotation of a bar-shaped magnet and clocking times corresponding to the detected rotation; and an abnormal rotation determination unit for determining whether the rotation driving mechanism is abnormal by comparing an interval calculated from the clocked times to a time period.

In accordance with a second aspect of the present invention, there is provided a method of controlling a plasma processing apparatus having a processing chamber for accommodating therein an object to be processed; a plurality of bar-shaped magnets rotatably installed standing around the processing chamber; and a rotation driving mechanism for synchronously rotating the bar-shaped magnets, the method including the steps of detecting a rotation of a bar-shaped magnet and clocking times corresponding to the rotation; and determining whether the rotation driving mechanism is abnormal by comparing an interval calculated from the clocked times and a time period.

In accordance with a third aspect of the present invention, there is provided a program for performing a method of controlling a plasma processing apparatus having a processing chamber for accommodating therein an object to be processed; a plurality of bar-shaped magnets rotatably installed standing around the processing chamber; and a rotation driving mechanism for synchronously rotating the bar-shaped magnets, the program including a rotation detection module for detecting a rotation of a bar-shaped magnet and clocking times corresponding to the rotation; and an abnormal rotation determination module for determining whether the rotation driving mechanism is abnormal by comparing an interval calculated from the clocked times to a time period.

In accordance with the aforementioned plasma processing apparatus, the method of controlling the plasma processing apparatus and the program for performing the method of controlling the plasma processing apparatus, it is determined whether the rotation driving mechanism is abnormal by detecting rotations of the bar-shaped magnets and clocking the rotations, and an comparing a time calculated from the clocked rotations to a specified time. Thus, it is possible to detect whether the rotations of the cylindrical magnets are stable or otherwise. Once unstable rotation has been detected, the plasma processing is stopped and maintenance is performed on the rotation driving mechanism to prevent the magnetic field in the processing chamber from becoming nonuniform. Further, given that detection of unstable rotation prompts the need for maintenance, it becomes possible to perform maintenance on the rotation driving mechanism at proper timings. Therefore, a plasma processing can be performed uniformly on the surface of the semiconductor wafer and, moreover, it becomes unnecessary to reduce the maintenance cycle of the rotation driving mechanism. Ultimately, the in-surface uniformity of plasma processing can be assured without compromising the steady and continuous operation of the plasma processing apparatus.

Preferably, the plasma processing apparatus includes an abnormality notification unit for notifying, when the rotation driving mechanism is in an abnormal state, the abnormal state. Accordingly, a user of the plasma processing apparatus is allowed to perform maintenance on the rotation driving mechanism at proper timings.

In the plasma processing apparatus, preferably, the time period is a reference time corresponding to a specified number of rotations of the bar-shaped magnet and the abnormal rotation determination unit calculates an elapsed time required to complete the specified number of rotations to determine whether the rotation driving mechanism is abnormal by comparing the reference time to the calculated elapsed time. Accordingly, since a slight change in the rotational velocity will have only a small impact on the overall elapsed time required for a specified number of rotations, it can be more correctly determined whether the rotation driving mechanism is abnormal.

In the plasma processing apparatus, preferably, the abnormal rotation determination unit determines that the rotation driving mechanism is abnormal when an absolute value of the difference between the calculated elapsed time and the reference time is larger than an allowable value. Accordingly, it is possible to avoid unnecessary determinations that the rotation driving mechanism is abnormal. Ultimately, the present apparatus further prevents its throughput from declining.

In the plasma processing apparatus, preferably, the rotation detection unit clocks the times at specific timings as the bar-shaped magnet is rotated by a rotational angle. The rotations the cylindrical magnets are clocked as they are rotated by a specified angle, so that the number of times clocked for a fixed time can be increased. Thus, it can be more correctly determined whether the rotation driving mechanism is abnormal.

Preferably, the plasma processing apparatus includes a time compensation unit for compensating a time presently clocked at a specific timing according to the difference between the time presently clocked at the specific timing and a time clocked at an immediately preceding timing of the specific timing. Accordingly, although a time is missed by error of the rotation detection unit, the time presently clocked at a specific timing can be adequately compensated. Thus, without being affected by clocking error of the rotation detection unit, the plasma processing apparatus can determine reliably whether the rotation driving mechanism is abnormal.

In the plasma processing apparatus, preferably, the abnormal rotation determination unit performs a statistical analysis of the times clocked at the specific timings to obtain a predicted time corresponding to a next specific timing based on a result of the statistical analysis and, further, determines whether the rotation driving mechanism is abnormal by comparing the predicted time to a time clocked at the next specific timing. Thus, it becomes unnecessary to depend on critical values to determine the stability, and this apparatus allows for precise determination as to whether the rotation driving mechanism is abnormal.

Preferably, the plasma processing apparatus includes a rotational acceleration control unit for controlling rotational acceleration of the bar-shaped magnet. Accordingly, the motor can be prevented from being subject to an abnormal load. Ultimately, a decline in the throughput of the plasma processing apparatus due to a breakdown of the motor will not occur.

Preferably, the plasma processing apparatus includes a rotation stop position control unit for detecting a rotation of the bar-shaped magnet to control a rotation stop position of the bar-shaped magnet. Positioning error of the cylindrical magnets resulting from adjacent cylindrical magnets attracting each other in the plasma processing apparatus can be avoided.

Preferably, the plasma processing apparatus includes a rotation control unit for controlling a rotation of the bar-shaped magnet according to a determination result when the rotation driving mechanism is determined to be abnormal. Since a rotation of the bar-shaped magnet is controlled according to a determination result when the rotation driving mechanism is determined to be abnormal, there is no need to instantly perform maintenance on the rotation driving mechanism. Therefore, the plasma process can be uniformly performed uninterrupted, thereby maintaining the throughput of the plasma processing apparatus.

Preferably, the plasma processing apparatus includes another rotation control unit for controlling a rotation of the bar-shaped magnet based on the predicted time corresponding to the next specific timing. That is, if the rotation driving mechanism's abnormality is expected until reaching the next specific timing, the rotation of the bar-shaped magnet is controlled. Thus, it is possible to maintain a uniform magnetic field in the processing chamber and as a result, plasma processing can be performed uniformly on the surface of the semiconductor wafer.

Preferably, the plasma processing apparatus includes an operational record storage unit for storing an operational record of the plasma processing apparatus when the rotation driving mechanism is determined to be abnormal. Hence, a user can quickly and easily investigate causes of the rotation driving mechanism's abnormality based on the apparatus log.

Preferably, the plasma processing apparatus includes a controller for controlling operations of components of the plasma processing apparatus based on operational states and state transitions, the operational states being defined as states of operations of the components in a plasma processing and the state transitions being defined as transitions between the operational states. That is, in the plasma processing apparatus, only defined operational states are performed and, likewise, a shift to a next operational state conforms to defined state transitions. Therefore, no component of the plasma processing apparatus performs any unnecessary operation, and this makes it possible to assure the proper operational states of the plasma processing. Further, operational states may be defined as desired, whereby desired operations can be controlled.

BRIEF DESCRIPTION OF THE DRAWINGS

The above and other objects and features of the present invention will become apparent from the following description of preferred embodiments, given in conjunction with the accompanying drawings, in which:

FIG. 5 is the flowchart of a stability monitoring process performed by CPU in State transition (3) shown in FIG. 4;

FIG. 6 is an apparatus log of the plasma processing apparatus that is stored in a memory if the motor's rotation becomes unstable;

DETAILED DESCRIPTION OF THE PREFERRED EMBODIMENTS

Preferred embodiments of the present invention will now be described with reference to the accompanying drawings.

First, a plasma processing apparatus in accordance with a first preferred embodiment of the present invention is explained.

Figure 1A:
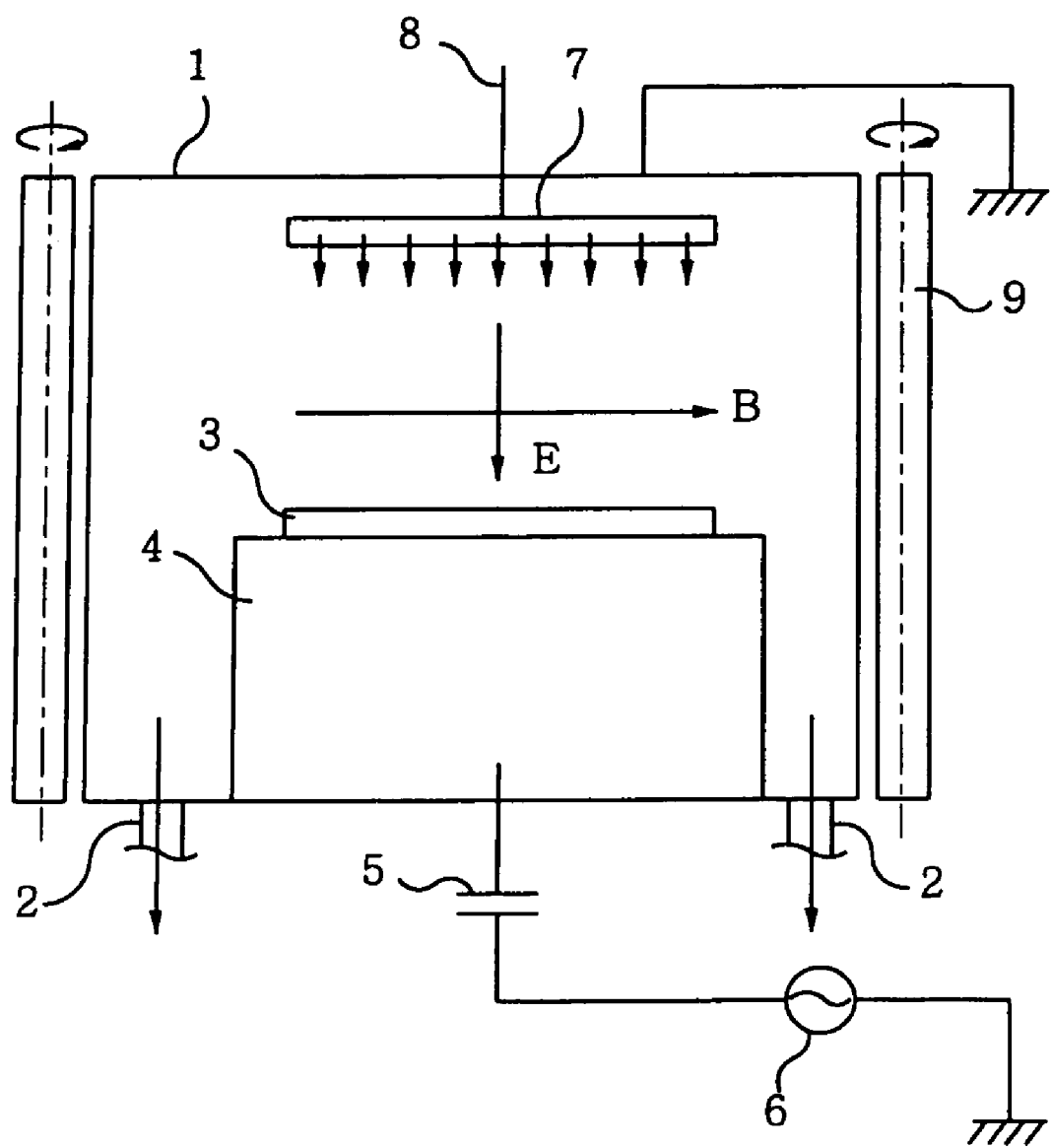
FIGS. 1A and 1B respectively show a cross sectional view and a perspective view showing schematic configurations of a DRM type plasma processing apparatus which is a plasma processing apparatus in accordance with a first preferred embodiment of the present invention.
Figure 1B:
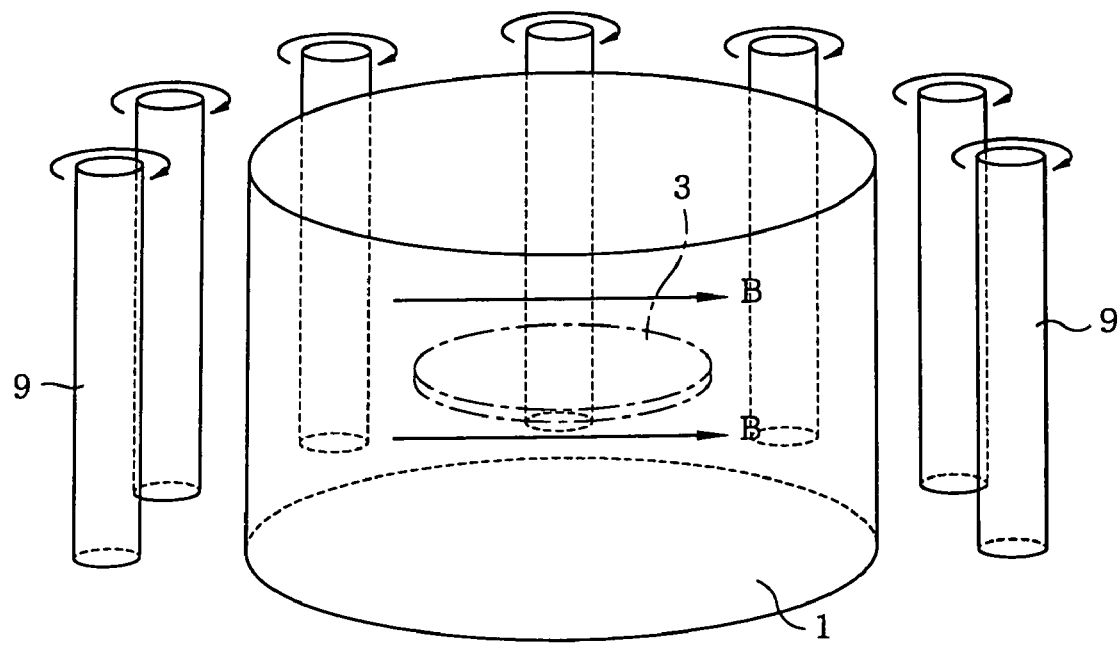

FIGS. 1A and 1B respectively show a cross sectional view and a perspective view of a schematic configuration of a DRM type plasma processing apparatus which is a plasma processing apparatus in accordance with the first preferred embodiment of the present invention.

The DRM type plasma processing apparatus shown in FIG. 1A includes a cylindrical processing chamber 1 made of a conductive material such as aluminum; gas exhaust pipes 2 connected to a lower portion of the processing chamber 1; a susceptor 4 serving as a lower electrode for mounting a semiconductor wafer 3 thereon, the susceptor 4 being disposed on a lower surface of processing chamber 1 and made of a conductive material such as aluminum; a high frequency power supply 6 connected to the susceptor 4 via a blocking capacitor 5; a hollow upper electrode 7 which is shaped like a flat disk and disposed so as to face the susceptor 4; a supply line 8 which is disposed at the center of a top surface of the upper electrode 7 and communicates with an etching gas supply source (not shown) through the central portion of the processing chamber 1's top surface; and twelve cylindrical magnets (magnets in bar shape) 9 that are permanent magnets disposed at equal intervals around the processing chamber 1.

The processing chamber 1 is sealed airtight and vacuum exhausted by a vacuum pump (not shown) via the gas exhaust pipes 2 to have a vacuum level of, e.g., 1.33 Pa ($10^{-2}$ Torr) or less.

The susceptor 4 attracts and holds the semiconductor wafer 3 by using Coulomb force of, e.g., an electrostatic chuck (not shown) attached on a top surface thereof. Further, the susceptor 4 has therein a cooling device using a coolant such as helium, and the cooling device cools down the semiconductor wafer 3 to a desired temperature during plasma processing. Further, a high frequency voltage of 13.56 MHz is applied to the susceptor 4 from the high frequency power supply 6 via the blocking capacitor 5 during plasma processing.

The upper electrode 7 is grounded so as to maintain a ground potential during plasma processing. Further, the upper electrode 7 supplies etching gas from the supply line 8 evenly into the processing chamber 1.

The twelve cylindrical magnets 9 are disposed around the processing chamber 1 so that each magnet is paired with another magnet which is arranged to have point symmetry about the central axis of the chamber with respect to each other. This arrangement produces a horizontal magnetic field B in the processing chamber 1, the magnetic field B being parallel to the semiconductor wafer 3 on the susceptor 4. The number of cylindrical magnets 9 is not limited to twelve, and a proper number of magnets 9 can be chosen and disposed around the processing chamber 1 depending on the plasma processing conditions. Regardless of their number, the magnets 9 must be disposed around the processing chamber 1 so that each pair has point symmetry as in this embodiment. It should be noted that five cylindrical magnets 9 at the front side of the processing chamber 1 are omitted in FIG. 1B.

Figure 2:
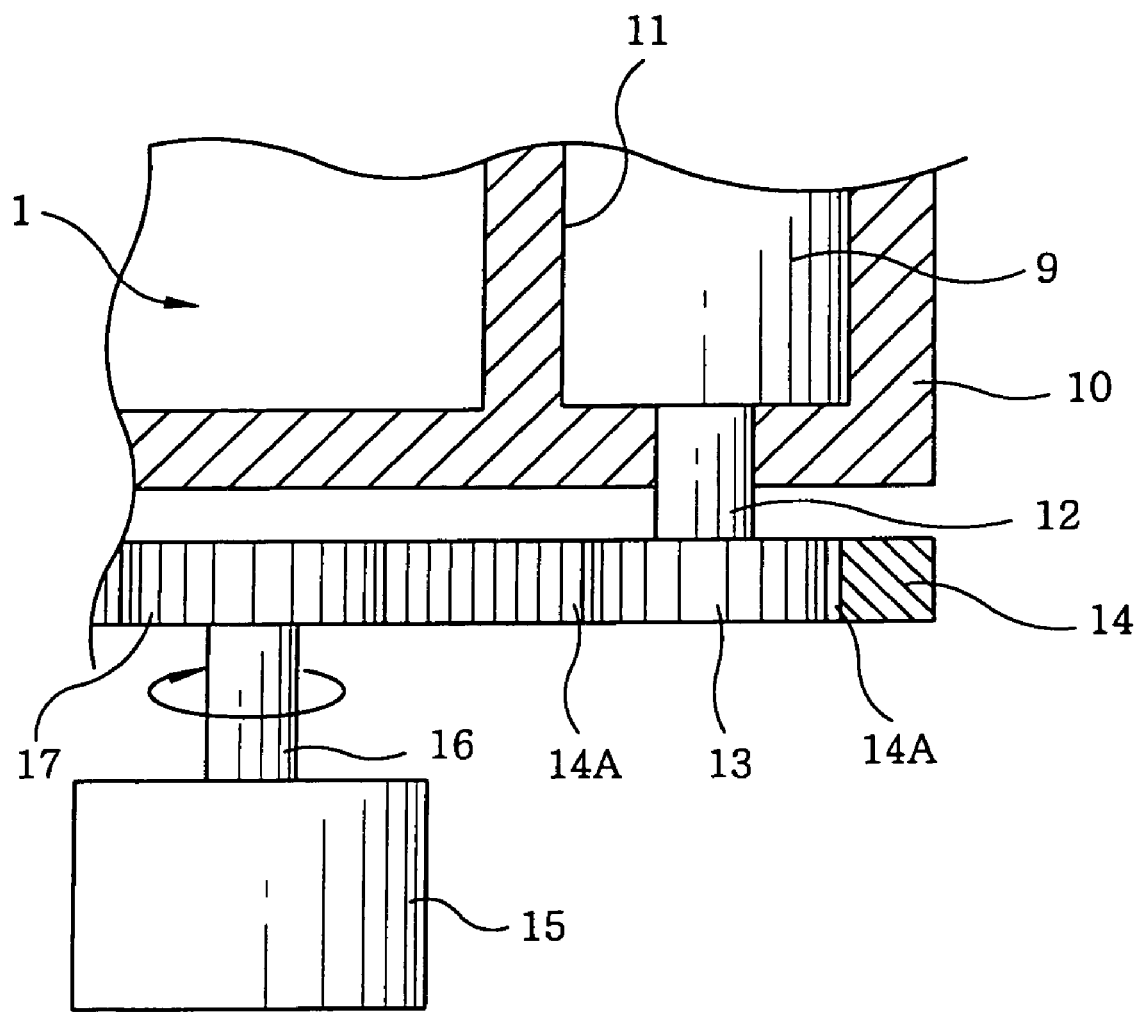
FIG. 2 shows a cross sectional view of a schematic configuration of a rotation driving mechanism of cylindrical magnets depicted in FIGS. 1A and 1B.

FIG. 2 illustrates a cross sectional view showing a schematic configuration of a rotation driving mechanism of the cylindrical magnets 9 shown in FIGS. 1A and 1B.

Referring to FIG. 2, cylindrical casings 11 matching the number of cylindrical magnets 9 are formed in a peripheral wall 10 of the processing chamber 1, and the cylindrical magnets 9 are respectively accommodated in the cylindrical casings 11. Shafts are respectively attached to upper and lower ends of the cylindrical magnets 9, and the cylindrical magnets 9 are supported by the shafts such that they can rotate in the cylindrical casings 11 of the peripheral wall 10. Small-diameter gears 13 are respectively attached to the shafts 12 of the lower ends of the cylindrical magnets 9. Further, an annular large-diameter gear 14 having an outside diameter corresponding to an outside diameter of the processing chamber 1 is disposed under the processing chamber 1. Inner teeth 14A are formed around inside the large-diameter gear 14, and the inner teeth 14A engage with small-diameter gears 13 of the lower ends of the cylindrical magnets 9. Further, a motor 15 is disposed between adjacent small-diameter gears 13, and a transfer gear 17 fixed at a rotation axis 16 of the motor 15 engages with the inner teeth 14A of the large-diameter gear 14 in the same way as the small-diameter gears 13 of the cylindrical magnets 9.

The transfer gear 17 of the motor 15 transmits the rotational force of the motor 15 to the entire small-diameter gears 13 via the large-diameter gear 14, whereby the whole cylindrical magnets 9 are synchronously rotated in the same direction, e.g., clockwise, respectively. Accordingly, the horizontal magnetic field B is rotated on a plane parallel to the semiconductor wafer 3 on the susceptor 4 in the processing chamber 1. In the first preferred embodiment, the motor 15, the large-diameter gear 14, the small-diameter gears 13 and the transfer gear 17 constitute the driving mechanism of the cylindrical magnets 9. Further, instead of disposing the motor 15 between the adjacent small-diameter gears 13 as described above, the rotation axis 16 of the motor 15 can be directly connected to the shaft 12 of the lower end of one cylindrical magnet 9 to synchronously rotate the whole cylindrical magnets 9.

Further, the types of permanent magnets for the cylindrical magnets 9 are not particularly limited, but alloy magnets such as a Fe—Cr—Co based type, or ferrite magnet are preferable. Further, the rotational velocity of the cylindrical magnets 9 is preferably set at 5 to 60 rpm and, more preferably, 15 to 25 rpm. At rotational velocity below 5 rpm, it is difficult to produce a uniform magnetic field on the semiconductor wafer 3 since the rotation of the horizontal magnetic field B is insufficient. In contrast, at rotational velocity above 60 rpm, no additional benefit is achieved in producing a uniform magnetic field and, further, the wear of the large-diameter gear 14, the small-diameter gears 13 and the transfer gear 17 tend to become more severe.

Generally speaking, the large-diameter gear 14 is made of resin, e.g., MC (mono cast) nylon, for the purpose of reducing weight. Further, the transfer gear 17 of the motor 15 is made of metal such as stainless steel, which is easy to cast. However, when the inner teeth 14A of the large-diameter gear 14 engage with the outer teeth of the transfer gear 17 to transfer the rotational force, a slight vibration is caused by backlash. The slight vibration is transmitted to the processing chamber 1 of the etch processing apparatus to thereby cause debris to be produced. Thus, the transfer gear 17 of the motor 15 is preferably made of resin, e.g., urethane (Hv90 or less), in order to prevent such backlash. Accordingly (i.e., employing such a material), the impact during engagement between the outer teeth of the transfer gear 17 and the inner teeth 14A of the large-diameter gear 14 can be absorbed, whereby backlash can be suppressed and the production of debris in the processing chamber 1 can be minimized.

Further, the inner peripheral surface of the large-diameter gear 14 and the outer peripheral surface of the transfer gear 17 can be made smooth by removing the inner teeth 14A of the large-diameter gear 14 and the outer teeth of the transfer gear 17. Then, the outer peripheral surface of the transfer gear 17 is coated with resin such as urethane and contacted with the inner peripheral surface of the large-diameter gear 14, whereby friction is used to transmit rotational force between the gears. Accordingly, the source of backlash can be eliminated and debris in the processing chamber 1 can be reduced.

Further, at a shaft 12 of a lower end of one cylindrical magnet 9, a pulley (ring) is disposed coaxially with a small-diameter gear 13. Then, another pulley is disposed at a rotation axis 16 of the motor 15 instead of the transfer gear 17, and a belt such as V belt is fitted around the pulley of the cylindrical magnet 9 and that of the motor 15, whereby rotational force can be transmitted between the pulleys. In this manner, the cause of backlash is eliminated and rotational force can be transmitted smoothly, so that the production of debris in the processing chamber 1 can be reduced.

Further, it is also acceptable to increase the number of the outer teeth of the transfer gear 17 and the number of the inner teeth 14A of the large-diameter gear 14. Accordingly, the frequency of collision between the outer teeth and the inner teeth 14A is increased, and the frequency of slight vibrations caused by backlash is also increased. If inputs for a unit period are equal, the higher the frequency, the smaller the amplitude becomes. Therefore, the amplitude of slight vibrations caused by the backlash can be decreased, thereby reducing the amount of debris generated in the processing chamber 1.

Hereinafter, the operation of the etch processing apparatus is explained. First, the semiconductor wafer 3 is mounted on the susceptor 4 for attracting and holding it by Coulomb force of the electrostatic chuck in the processing chamber 1 which has been exhausted to a vacuum. Then, an etching gas is supplied into the processing chamber 1 from the supply line 8 via the upper electrode 7, and pressure of the etching gas is set to have a vacuum level of, e.g., 1.33 Pa ($10^{-2}$ Torr) or less.

Thereafter, a high frequency voltage of 13.56 MHz is applied to the susceptor 4 from the high frequency power supply 6 and a glow discharge is performed between the susceptor 4 and the upper electrode 7 with the etching gas, whereby plasma is generated by using the etching gas. At this time, since electrons in the plasma are much lighter than reactive ions and radicals (active species), the electrons move towards the susceptor 4 first. Accordingly, the susceptor 4 is self-biased to be minus via the blocking capacitor 5 and a potential difference is generated between the self-bias potential of the susceptor 4 and the plasma potential, whereby a vertical electric field E is formed between the plasma and the susceptor 4.

Further, a horizontal magnetic field B of, e.g., 600 Gauss is applied into the processing chamber 1 by the entire cylindrical magnets 9. The applied horizontal magnetic field B is orthogonal to the vertical electric field E to form orthogonal electric and magnetic fields, whereby the electrons in the plasma move in a cycloidal path near the susceptor 4. As a result, active species such as reactive ions in the plasma are further activated, and plasma is finally generated by a high density magnetron.

At this point, since the motor 15 is driven to transmit the rotational force to the respective cylindrical magnets 9 via the transfer gear 17, the large-diameter gear 14 and the small-diameter gears 13, the entire cylindrical magnets 9 are therefore synchronously rotated, for example, clockwise. By the synchronous rotation of the entire cylindrical magnets 9, the entire horizontal magnetic field B is rotated at a rotational velocity of, e.g., 20 rpm on a plane parallel to the semiconductor wafer 3 on the susceptor 4 in the processing chamber 1, the rotation of which is accompanied by changing the direction of cycloidal movement of electrons. Accordingly, plasma in the processing chamber 1 becomes completely uniform, and magnetron plasma having uniform plasma density is generated. Hence, the reactive ions in the plasma are made uniform in the processing chamber 1 so that ions are uniformly irradiated on the entire surface of the semiconductor wafer 3 on the susceptor 4, whereby plasma processing (e.g., reactive ion etching) can be performed uniformly on the entire surface of the semiconductor wafer 3.

Figure 3:
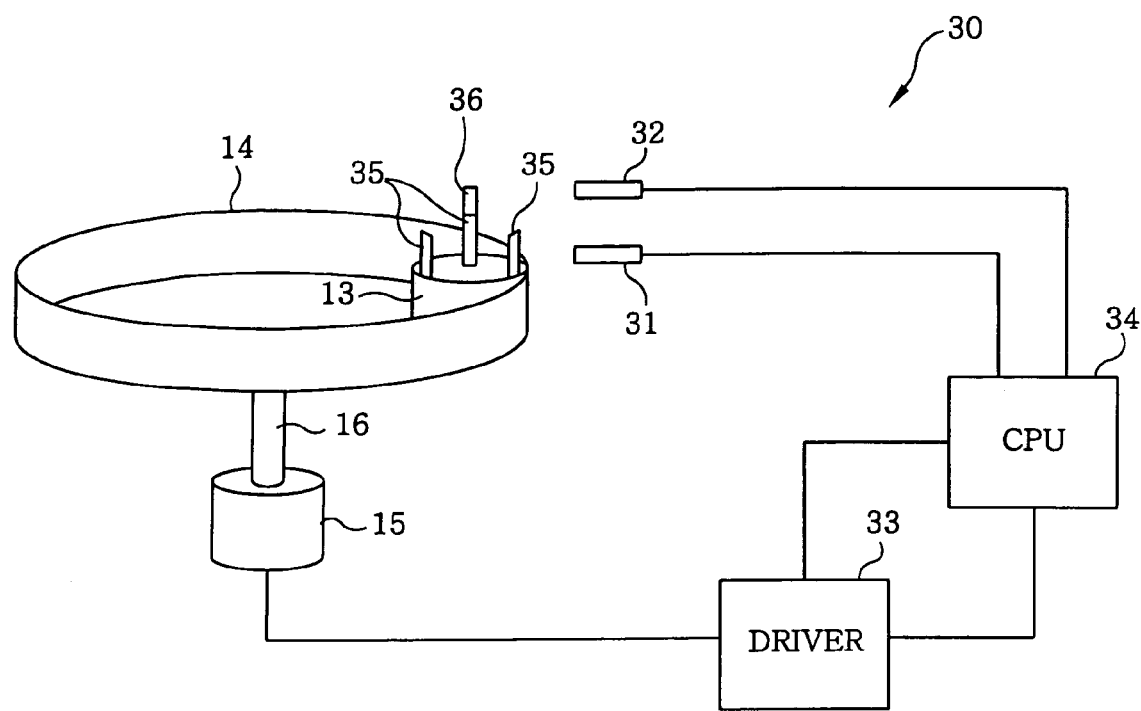
FIG. 3 shows a schematic configuration of a control system of the rotation driving mechanism included in the etch processing apparatus shown in FIG. 1A.

FIG. 3 shows a schematic configuration of a control system of the rotation driving mechanism included in the etch processing apparatus shown in FIG. 1A.

The control system 30 of the rotation driving mechanism shown in FIG. 3 includes: a trigger sensor (rotation detection unit) 31 for detecting the rotation of the small-diameter gears 13 of the cylindrical magnets 9 as the gears 13 are rotated by a specified rotational angle; a position sensor 32 for detecting the rotational position of the small-diameter gears 13; a driver 33 which is connected to the motor 15, for controlling the rotation of the motor 15; and a CPU (abnormal rotation determination unit) 34 connected to the trigger sensor 31, the position sensor 32 and the driver 33. Further, each of the small-diameter gears 13 has three trigger sensor pins 35 and one position sensor pin 36.

Each of the trigger sensor pins 35 has a rectangular plate shape and joined to an inner peripheral surface of the small-diameter gear 13 such that one end portion thereof is projected upward from the small-diameter gear 13. The trigger sensor pins 35 are disposed at regular intervals, i.e., 120 degrees apart (the specified degrees of rotational angle), along the circumferential direction on the inner peripheral surface of the small-diameter gear 13. Further, the position sensor pin 36 has a rectangular plate shape which is longer than the trigger sensor pin 35 in length, and joined to the inner peripheral surface of the small-diameter gear 13 such that one end portion thereof is projected above the end portion of the trigger sensor pin 35. In this case, the position sensor pin 36 is disposed on the inner peripheral surface of the small-diameter gear 13 in the following manner: when the position sensor pin 36 directly faces the position sensor 32, the rotational position of the cylindrical magnet 9 is to be at a specified rotation stop position, e.g., a position where the cylindrical magnet 9 and an adjacent cylindrical magnet 9 of the plasma processing apparatus do not attract each other.

Further, the trigger sensor 31 and the position sensor 32 are respectively disposed at levels corresponding to the heights of projected end portions of the trigger sensor pins 35 and the position sensor pin 36. The trigger sensor 31 and the position sensor 32 detect the trigger sensor pins 35 and the position sensor pin 36, respectively, to thereby monitor the rotation of the cylindrical magnet 9. Furthermore, the pitch of the small-diameter gear 13 is set to be equal to that of the transfer gear 17 of the motor 15, so that the rotation of the cylindrical magnet 9 coincides with the motor 15. Consequently, the trigger sensor 31 detects the trigger sensor pins 35 as the cylindrical magnets 9 as well as the motor 15 are rotated by 120 degrees (a specified rotational angle) (i.e., at specified timings), and the position sensor 32 detects the position sensor pin 36 as the cylindrical magnets 9 and the motor 15 make one revolution.

Further, whenever the trigger sensor 31 detects the trigger sensor pins 35, the trigger sensor 31 transmits a detection sequence to the CPU 34 as an electrical signal. At this time, the trigger sensor 31 clocks times (hereinafter, referred to as "time stamps") when the trigger sensor pins 35 are detected corresponding to the detection sequence and transmits them together with the detection sequence to the CPU 34. The CPU 34 stores the detection sequence and the time stamps in, e.g., a memory (not shown) by arranging them according to time series.

The driver 33 controls degree of rotation, rotational velocity and rotational acceleration and the like of the motor 15 based on an instruction transmitted from the CPU 34. Further, whenever the driver 33 detects an abnormality of the motor 15, the driver 33 sends a motor alarm to the CPU 34 as an electrical signal.

In the etch processing apparatus shown in FIG. 1A, the CPU 34 reads and performs a control program of the control system 30, wherein the operational states of every component of the etch processing apparatus, especially, every component of the control system 30, are defined as an "operational states", and transitions between defined operational states, i.e., progression of processes in the etch processing, are defined as "state transitions".

Figure 4:
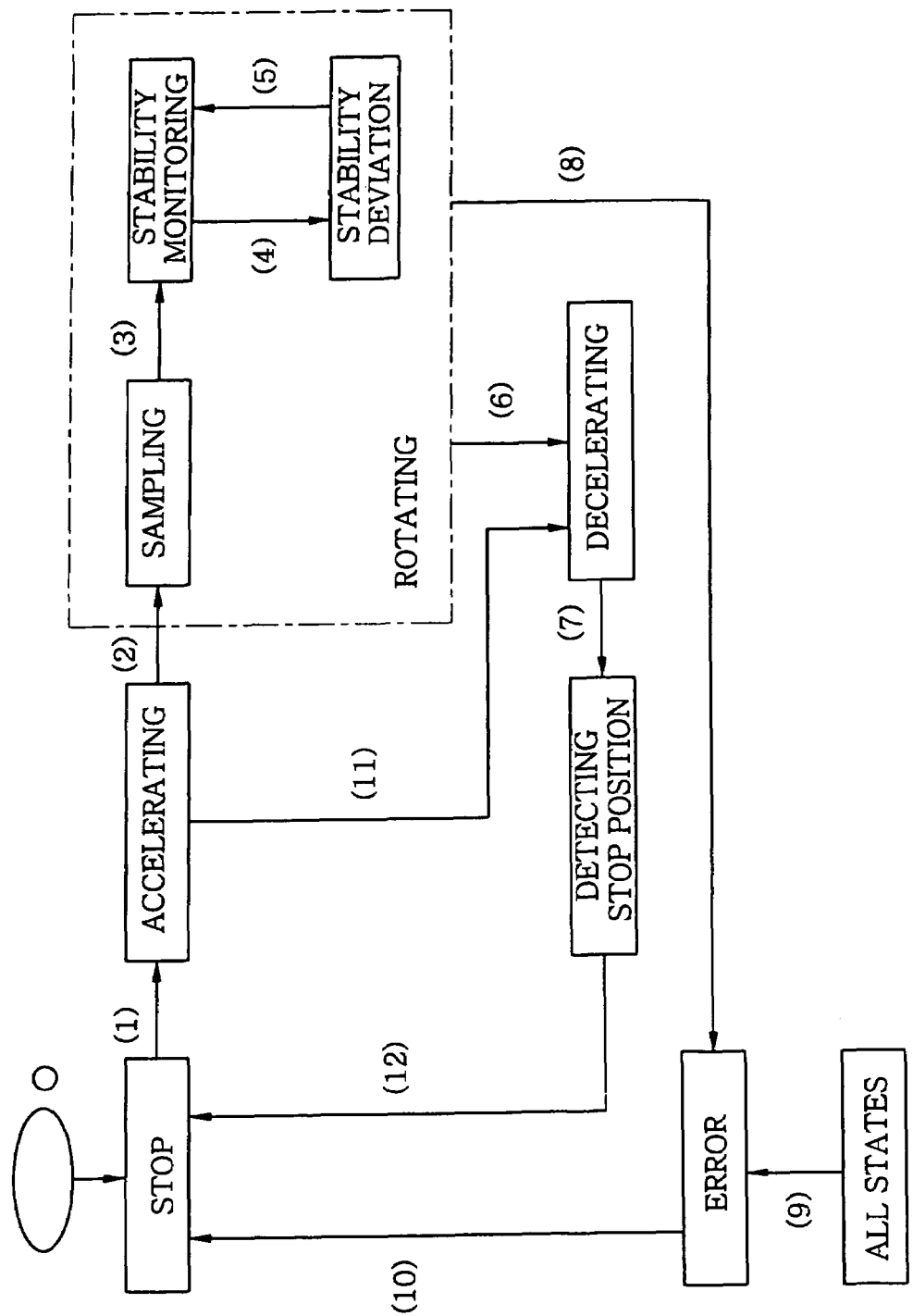
FIG. 4 is an operation flowchart displaying operations and changeovers that are defined in a control program of the control system shown in FIG. 3.

To elaborate, as shown in FIG. 4, "stop", "accelerating", "rotating", "decelerating", "detecting stop position", "error" and "all states" are defined as the operational states. In particular, "rotating" is subdivided into three operational states, i.e., "sampling", "stability monitoring" and "stability deviation". In "stop", the cylindrical magnets 9 are stopped. In "accelerating", the rotation of the motor 15 is controlled by the driver 33 and the cylindrical magnets 9 are accelerating at a specified rate, e.g., 2 rpm/sec. In "rotating", the cylindrical magnets 9 are rotating at a specified rotational velocity, e.g., 20 rpm. In "sampling", after a rotation acceleration of the cylindrical magnets 9, initial data of the rotation of the cylindrical magnets 9 are detected by the trigger sensor 31. In "stability monitoring", based on the detected data by sampling, it is determined that the rotational velocity of the cylindrical magnets 9 is within an allowable error range and, further, the cylindrical magnets 9 are rotating within an allowable error range of rotational velocity, e.g., 20 rpm±X % (X is a certain integer from 0.5 to 100). "Stability deviation" is a warning state, wherein the rotational velocity of the cylindrical magnets 9 is deviated from the allowable error (X %) range of rotational velocity. In "decelerating", the rotation of the motor 15 is controlled by the driver 33, whereby the cylindrical magnets 9 are decelerating. In "detecting stop position", the rotational velocity of the cylindrical magnets 9 is controlled to be slow, e.g., 1 rpm, and the position of the position sensor pin 36 is detected by the position sensor 32. In "error", the rotations of the cylindrical magnets 9 are stopped, and the control system 30 is off and waiting for recovery (back to on-state) by a user or an operator. "All states" refer to every state except the above-mentioned "rotating", "stop" and "error".

Further, as state transitions, the following transitions (1) to (12) are defined as below.

State transition (1) is a shift from "stop" to "accelerating", for example, in starting a lot processing. At this time, the CPU 34 controls the drier 33 to perform an accelerating process wherein the cylindrical magnets 9 are accelerating at a specified acceleration, e.g., 2 rpm/sec.

State transition (2) is a shift from "accelerating" to "sampling" after finishing the accelerating process. At this time, the CPU 34 controls the trigger sensor 31 to sequentially detect the trigger sensor pins 35 whenever the cylindrical magnets 9 are rotating by 120 degrees. Accordingly, detection sequences of the trigger sensor pins 35 and the time stamps corresponding to the detection sequences are transmitted to the CPU 34 and, further, the CPU 34 performs a sampling process for storing the detection sequences and the time stamps in the memory etc. by arranging them according to time series.

State transition (3) is a shift from "sampling" to "stability monitoring" after finishing the sampling process. At this time, the CPU 34 performs a stability monitoring process to be described later.

State transition (4) is a shift from "stability monitoring" to "stability deviation" when the rotational velocity of the cylindrical magnets 9 deviates from the allowable error (X %) range of rotational velocity. At this time, in case no etching process is underway, for example, when the semiconductor wafer 3 is being loaded or unloaded, a warning which notifies that the rotational velocity of the cylindrical magnets 9 is not stable is displayed on a monitor (abnormality notification unit) (not shown) of the plasma processing apparatus by the CPU 34 while stopping loading another semiconductor wafer 3. In this case, the rotation of the cylindrical magnets 9 is not stopped. However, if etch processing is being performed, in addition to the display, the CPU 34 sends an alarm which notifies that etch processing has been underway and stops the etch processing, while displaying an instruction for "re-execution" or "stop processing" on the monitor.

State transition (5) is a shift from "stability deviation" to "stability monitoring" when the rotational velocity of the cylindrical magnets 9 returns within the allowable error (X %) range of rotational velocity. At this time, the CPU 34 withdraws the above-mentioned warning on the monitor.

State transition (6) is a shift from "rotating" to "decelerating", for example, after finishing the lot processing. At this time, the CPU 34 controls the driver 33 to decelerate the rotations of the cylindrical magnets 9.

State transition (7) is a shift from "decelerating" to "detecting stop position" after finishing the decelerating process. At this time, the CPU 34 controls the driver 33, whereby the rotational velocity of the cylindrical magnets 9 is set to be slow, e.g., 1 rpm. Further, the position sensor 32 is controlled to perform a stop position detecting process for detecting the position sensor pin 36.

State transition (8) is a shift from "rotating" to "error", for example, when the trigger sensor 31 does not detect the rotation of the cylindrical magnets 9 for a long time, e.g., 4 seconds, or when the motor alarm is sent from the driver 33. At this time, a warning is displayed on the monitor by the CPU 34. State transition (9) is a shift from "all states" to "error" when the motor alarm is sent from the driver 33. At this time, an error message is displayed on the monitor (not shown) of the plasma processing apparatus by the CPU 34, and the rotation of the motor 15 is stopped. State transition (10) is a shift from "error" to "stop".

State transition (11) is a shift from "accelerating" to "decelerating" state as etch processing is stopped while the cylindrical magnets 9 are rotating and accelerating. At this time, the CPU 34 performs the aforementioned decelerating process.

State transition (12) is a shift from "detecting stop position" to "stop" when the position sensor 32 detects the position sensor pin 36. At this time, the CPU 34 controls the driver 33 to thereby perform a stop processing for stopping not only the rotation of the motor 15 but also those of the cylindrical magnets 9.

Further, the CPU (controller) 34 controls the operation of every component of the etch processing apparatus according to the operational states or state transitions that are discussed above and defined in the etch processing. That is, in the etch processing apparatus, only defined operational states are performed and, likewise, a shift to a next operational state conforms to defined state transitions. Therefore, no component of the etch processing apparatus performs any unnecessary operation, and this makes it possible to assure the proper operational states of the etch processing. Further, the operational state of every component may be defined as desired without being limited to the above-mentioned operational states or state transitions. Thus, desired operations can be carried out in the etch processing apparatus.

FIG. 5 provides a flow chart of a stability monitoring process performed by a CPU in State transition (3) shown in FIG. 4.

As shown in FIG. 5, first, the operational state is shifted to "rotating" (step S50), and the CPU 34 stores detection sequence of the detected trigger sensor pins 35 and time stamps in the memory by arranging them according to time series (step S51).

Then, the CPU 34 determines whether the number of time stamps stored in the memory is a specific number (a specific number of rotations), e.g., 16 or more (step S52). When the number is less than 16, the stability monitoring process returns to step S51. When the number is equal to or more than 16, the difference between a time stamp corresponding to a pin detected fifteen detections earlier than a presently detected pin and a time stamp corresponding to the presently detected pin is calculated as elapsed time (step S53). It is determined whether the calculated elapsed time is within an allowable range (step S54). For instance, when the rotational velocity of the cylindrical magnets 9 and the allowable error are respectively set at 20 rpm and 5%, the number of rotations of the cylindrical magnets 9 corresponding to fifteen time stamps is five (because three time stamps equal one rotation), and a reference time (specified time) corresponding thereto is 15 seconds (at 20 rpm, it takes 15 seconds to make 5 rotations). Accordingly, it is determined whether the elapsed time is in a range from 14.25 to 15.75 seconds. That is, it is determined whether an absolute value of the difference between the calculated elapsed time and the reference time is equal to or less than an allowable value, i.e., 0.75 seconds.

After determination of step S54, when the absolute value of the difference between the calculated elapsed time and the reference time is larger than 0.75 (NO at step S54), the CPU 34 determines that the rotations of the cylindrical magnets 9, i.e., the motor 15, are not stable (stability deviation) and an operational state is shifted from "stability monitoring" to "stability deviation" according to state transition (4) (step S55).

But after determination at step S54, when the absolute value of the difference between the calculated elapsed time and the reference time is equal to or less than 0.75 (YES at step S54), the CPU 34 determines that the rotations of the cylindrical magnets 9, i.e., the motor 15, are stable and the operational state is maintained to be "stability monitoring" (step S56).

Thereafter, the CPU 34 determines whether the operational state is "rotating". Namely, it is determined whether the state is one of conditions for causing state transition (6) or (8). If the operational state is "rotating", the stability monitoring process returns to step S51 and, if it is not, the process is completed.

In the plasma processing apparatus in accordance with the first preferred embodiment, the trigger sensor pins 35 of the small-diameter gears 13 are detected, and the time stamps in detection sequence of the trigger sensor pins 35 are clocked. By comparing the elapsed time calculated based on the time stamps and the reference time (specified time), it is determined whether the rotation of the motor 15 is stable. Thus, it is possible to detect whether the rotations of the cylindrical magnets 9 are stable or otherwise. Once unstable rotation has been detected, the plasma processing is stopped and maintenance is performed on the rotation driving mechanism to prevent the magnetic field in the processing chamber 1 from becoming nonuniform. Further, given that detection of unstable rotation prompts the need for maintenance, it becomes possible to perform maintenance on the rotation driving mechanism at proper timings. Therefore, a plasma processing, e.g., etch processing, can be performed uniformly on the surface of the semiconductor wafer 3 and, moreover, it becomes unnecessary to reduce the maintenance cycle of the rotation driving mechanism.

In the above-described plasma processing apparatus in accordance with the first preferred embodiment, when the rotation of the motor 15 becomes unstable, the operational state is shifted from "stability monitoring" to "stability deviation" according to State transition (4). At this time, a warning which notifies that the rotations of the cylindrical magnets 9 are unstable is displayed on the monitor of the plasma processing apparatus by the CPU 34. Accordingly, a user of the plasma processing apparatus is allowed to perform maintenance on the rotation driving mechanism at proper timings.

Further, in the above-described plasma processing apparatus in accordance with the first preferred embodiment, when comparing elapsed time versus reference time, an elapsed time required for a specified number of rotations of cylindrical magnets 9, e.g., five rotations, is calculated based on a stored time stamps. Since a slight change in the rotational velocity will have only a small impact on the overall elapsed time required for a specified number of rotations, this allows for more reliable monitoring of stable rotation of the motor 15.

Further, in the above-described plasma processing apparatus in accordance with the first preferred embodiment, when comparing elapsed time versus reference time, it determines the rotation of the motor 15 is unstable only when the absolute value difference between the calculated elapsed time and the reference time is bigger than a specified allowable value, e.g., X % of the reference time. In this manner, the monitoring of the motor 15's rotation becomes more reliable thereby avoiding unnecessary determinations that it is unstable. Ultimately, the present apparatus prevents its throughput from declining.

Moreover, in the above-described plasma processing apparatus in accordance with the first preferred embodiment, the time stamps are clocked as the cylindrical magnets 9 are rotated by 120 degrees, so that the number of time stamps clocked for a fixed time can be increased. Thus, it can be more correctly determined whether the rotations of the cylindrical magnets 9 are stable or not.

In a conventional plasma processing apparatus, since no operational state is defined for acceleration of the cylindrical magnets 9, the motor 15 can be subjected to an abnormal load due to improper acceleration, thereby causing its breakdown. But in the plasma processing apparatus of the first preferred embodiment, the operational state for accelerating the cylindrical magnets 9 is defined as "accelerating", and the CPU 34 controls the driver 33 in operational state "accelerating" such that the cylindrical magnets 9 are accelerating at 2 rpm/sec, thereby preventing the motor 15 from being subject to an abnormal load. Ultimately, a decline in the throughput of the plasma processing apparatus due to a breakdown of the motor 15 will not occur.

Further, in a conventional plasma processing apparatus, since the stop position of the cylindrical magnets 9 is not detected after completion of each lot and the like, when the rotations of the cylindrical magnets 9 are stopped at improper positions, for example, the adjacent cylindrical magnets 9 of the plasma processing apparatus can attract each other, so that positioning error of the cylindrical magnets 9 can result. In contrast, in the plasma processing apparatus of the first preferred embodiment, an operational state corresponding to detection of the cylindrical magnets 9' stop position is defined as "detecting stop position", and the CPU 34 controls the driver 33 in operational state "detecting stop position" such that the rotational velocity of the cylindrical magnets 9 is kept slow, e.g., 1 rpm. Further, the position of the position sensor pin 36 (where the adjacent cylindrical magnets 9 of the plasma processing apparatus do not attract each other) is detected by the position sensor 32. Therefore, positioning error of the cylindrical magnets 9 can be avoided.

In the above-described plasma processing apparatus in accordance with the first preferred embodiment, when the rotation of the motor 15 becomes unstable, the plasma process is stopped. However, the present invention is not limited thereto and, for example, the CPU 34 may control the driver 33 according to a calculated elapsed time to change the rotational velocity of the motor 15. Accordingly, even though it is determined that the rotation of the motor 15 is unstable, there is no need to instantly perform maintenance on the rotation driving mechanism. Therefore, the plasma process can be uniformly performed uninterrupted, thereby maintaining the throughput of the plasma processing apparatus.

Further, when the rotation of the motor 15 becomes unstable, the CPU 34 may store the apparatus log of the plasma processing apparatus in the memory (operational record storage unit) as shown in FIG. 6. Hence, a user can quickly and easily investigate causes of the rotation driving mechanism's abnormality based on the apparatus log.

Further, in the plasma processing apparatus of the first preferred embodiment, even though it has been determined that the rotation of the motor 15 is unstable, the rotations of the cylindrical magnets 9 are not stopped immediately. If this condition has been detected, the CPU 34 may display the number of rotations of the cylindrical magnets 9 on the monitor. Accordingly, a user can easily confirm the number of rotations of the cylindrical magnets 9. On occasions, for example, when the rotation of the motor 15 becomes stable again, the user will recognize this and at this time, a button for "re-execution" is selected or pressed to resume quickly the plasma processing.

Hereinafter, there will be described in detail a plasma processing apparatus in accordance with a second preferred embodiment of the present invention.

The second preferred embodiment has components and effects similar to those of the above-mentioned first preferred embodiment. Thus, to avoid redundancy, description of repeated components and effects are omitted and only different components and effects will be described later.

When the trigger sensor pins 35 are sequentially detected in the aforementioned stability monitoring process, one trigger sensor pin 35 may be undetected or missed (skipped), for example, because of dust and the like covering the surface of the trigger sensor 31. As a result, the time interval between successive time stamps after missing one trigger sensor pin 35 will be relatively long. In this case, when an elapsed time is calculated based on data which includes the erred time stamps, the calculated elapsed time will be longer than that obtained without such error.

In the plasma processing apparatus of the second preferred embodiment, the following time stamp skip compensation process is performed before step S51 shown in FIG. 5 to properly respond to the error.

Figure 7:
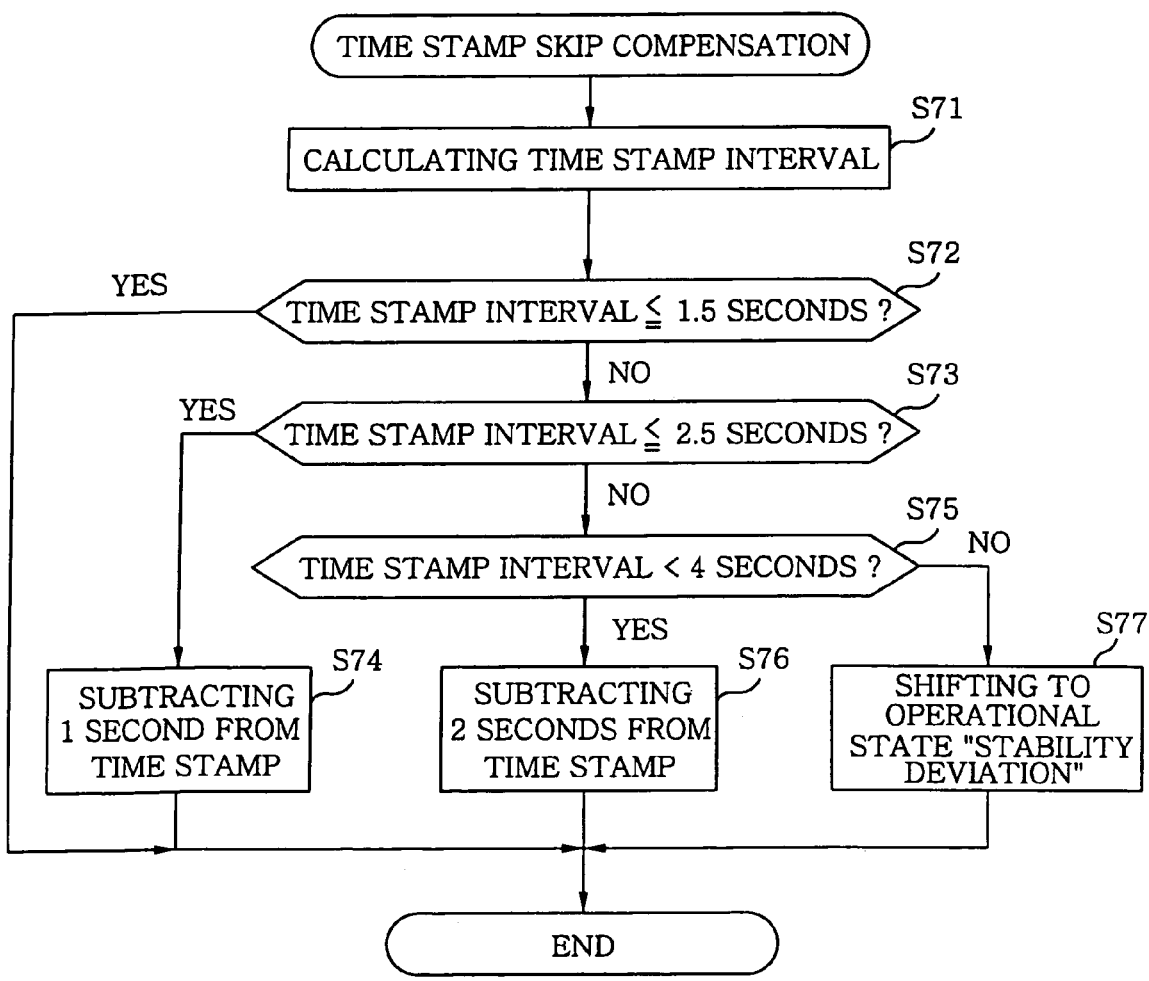
FIG. 7 is a flowchart showing a time stamp skip compensation process performed by the CPU in the plasma processing apparatus in accordance with a second preferred embodiment of the present invention.

FIG. 7 depicts a flow chart of a time stamp skip compensation process performed by the CPU 34 shown in FIG. 3 when the cylindrical magnets 9 are rotating at a rotational velocity of 20 rpm.

Referring to FIG. 7, first, the CPU 34 calculates the difference (hereinafter, referred to as a "time stamp interval") between a time stamp corresponding to a presently detected pin (at the present timing) and a time stamp corresponding to a pin detected right before presently detected pin (at the last timing) (step S71).

Then, it is determined whether the time stamp interval is equal to or less than the 1.5 seconds (step S72). If so, the process is completed immediately. Otherwise, if the time stamp interval is larger than 1.5 seconds (NO at step S72), it is determined whether the time stamp interval is equal to or less than the 2.5 seconds (step S73). If so, 1 second is subtracted from the time stamp corresponding to the presently detected pin. Further, 1 second is subtracted from the following time stamp (step S74) and the process is completed. If the time stamp interval is larger than the 2.5 seconds (NO at step S73), it is determined whether the time stamp interval is less than the 4 seconds (step S75). If the time stamp interval is less than the 4 seconds (YES at step S75), 2 seconds are subtracted from the time stamp corresponding to the presently detected pin. Further, 2 seconds are subtracted from the following time stamp (step S76) and the process is completed. If the time stamp interval is equal to or larger than the 4 seconds (NO at step S75), the CPU 34 determines that the rotation of the motor 15 is unstable, so that the operational state is immediately shifted from "stability monitoring" to "stability deviation" according to state transition (4) (step S77) and the process is completed.

In the plasma processing apparatus of the second preferred embodiment, since the time stamp corresponding to the presently detected pin is compensated according to a calculated time stamp interval, although one trigger sensor pin 35 is missed by the trigger sensor 31, the time stamp corresponding to the presently detected pin can be adequately compensated. Thus, without being affected by the missed trigger sensor pin 35, the plasma processing apparatus can determine reliably whether the rotations of the cylindrical magnets 9 are stable or otherwise.

Hereinafter, a plasma processing apparatus of a third preferred embodiment of the present invention will be discussed in detail.

The third preferred embodiment also has components and effects similar to those of the above-mentioned first preferred embodiment. Thus, to avoid redundancy, description of repeated components and effects are omitted and only different components and effects are discussed below.

In the above-mentioned stability monitoring process shown in FIG. 5, after a specified number of time stamps are stored in the memory, an elapsed time is calculated for the first time to determine whether the rotation of the motor 15 is stable. However, when the total time stamps stored in the memory reaches a certain level, a time stamp value corresponding to a next detected pin can be predicted based on the stored time stamps, whereby it can be determined whether the rotation of the motor 15 is stable based on the predicted time stamp.

Figure 8:
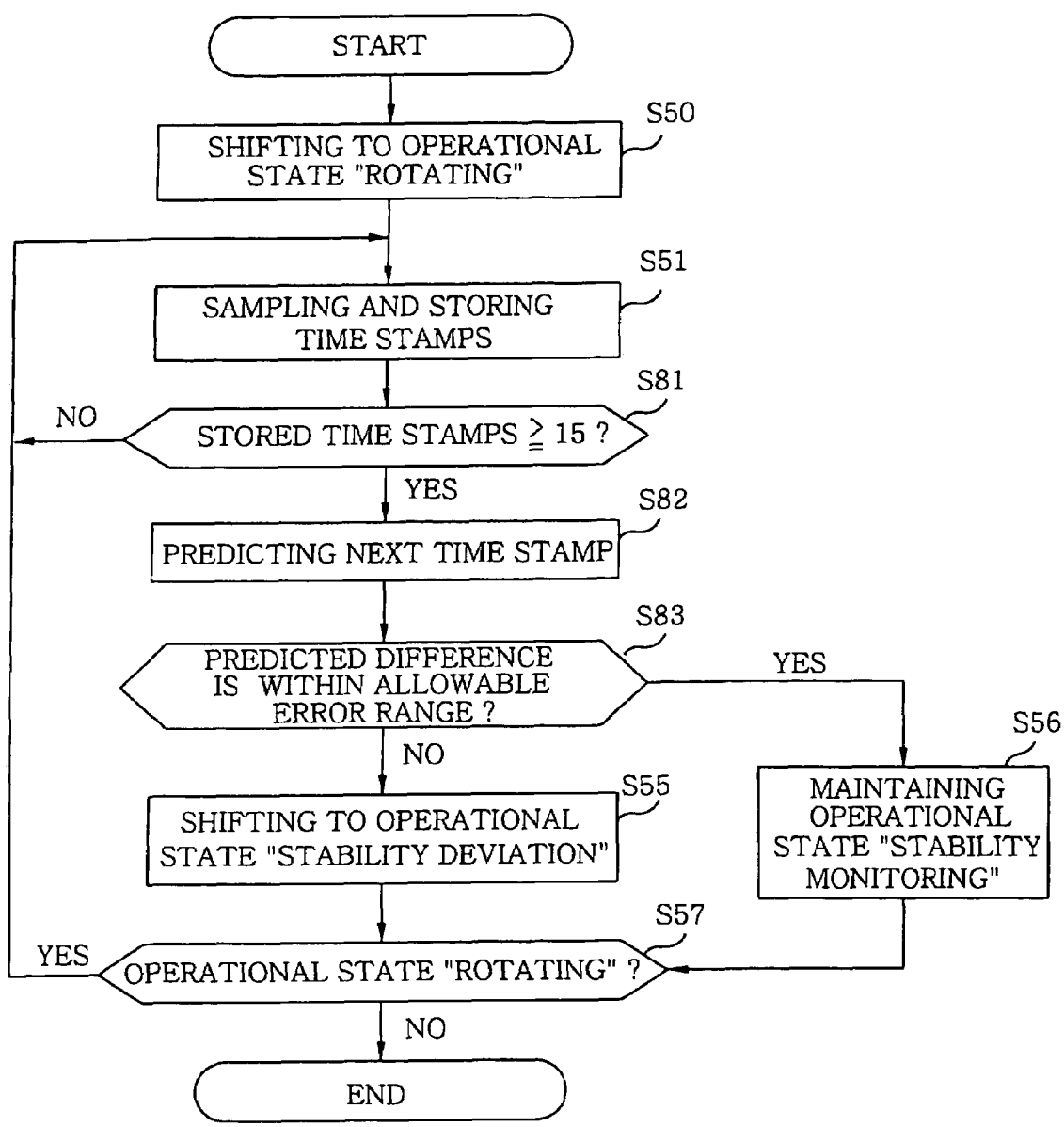
FIG. 8 shows a flowchart of another stability monitoring process performed by a CPU in a plasma processing apparatus in accordance with a third preferred embodiment of the present invention.

In the plasma processing apparatus of the third preferred embodiment, in responding properly to problems discovered by a predicted time stamp, as depicted in FIG. 8, the following process is performed instead of steps S52 to S54 in FIG. 5.

After step S51 shown in FIG. 5, the CPU 34 determines whether the number of total stored time stamps is equal to or more than, e.g., 15 (step S81). If it is less than 15, the process returns to step S51. If it is equal to or more than 15, based on the time stamp corresponding to a pin detected 14 detections earlier than the presently detected pin, an estimation (statistical analysis) is performed by a least squares method, whereby the time stamp corresponding to a next detected pin is predicted (step S82).

Thereafter, the time stamp corresponding to the next detected pin is clocked, and it is determined whether the difference (hereinafter, referred to as a "prediction difference") between the actually clocked time stamp and the predicted time stamp, both of which correspond to the next detected pin, is within an allowable error range (step S83). If within the range, the process proceeds to step S56. Otherwise, if the difference is not within an allowable error range, the process proceeds to step S55.

In the plasma processing apparatus of the third preferred embodiment, the time stamp corresponding to the next detected pin is predicted based on the statistical analysis result of time stamps stored in the memory. Further, based on the aforementioned prediction difference, it is determined whether the rotation of the motor 15 is stable. Thus, it becomes unnecessary to depend on user's experience or the like to determine the stability of the motor 15, and instead, this apparatus allows for precise determination as to whether the rotation of the motor 15 is stable or otherwise.

Further, in the plasma processing apparatus in accordance with the third preferred embodiment, the CPU 34 may control the driver 33 based on the predicted time stamp corresponding to the next detected pin to thereby control the rotational velocity of the motor 15. That is, if unstable rotation of the motor 15 is expected until reaching the next detected pin, the rotation of the motor 15 is controlled. Thus, it is possible to maintain a uniform magnetic field in the processing chamber and as a result, plasma processing can be performed uniformly on the surface of the semiconductor wafer.

Further, a storage medium (for storing therein software programs for performing the functions of the above-described preferred embodiments) is provided to a plasma processing apparatus, an external server or the like. CPU or MPU or such included in the plasma processing apparatus or the server reads the program codes stored in the storage medium and executes them, so that the object of the present invention can be achieved ultimately.

In this case, the program codes themselves read from the storage medium execute the functions of the above-described preferred embodiments so that the program codes and the storage medium for storing the program codes therein are also part of the present invention.

Further, for example, floppy (registered trademark) disk, hard disk, magneto-optical disk, CD-ROM, CD-R, CD-RW, DVD-ROM, DVD-RAM, DVD-RW, DVD+RW, magnetic tape, nonvolatile memory card, ROM etc. can be employed as the storage medium for providing the above program codes.

As described above, program codes may be read and performed by a computer in order to execute the functions of the above-described preferred embodiments. Additionally, based on instructions of the program codes, OS (operating system) and the like installed on the computer may execute the functions partially or entirely, and such an approach is also included in the present invention.

Further, after the program codes read from the storage medium are stored in a memory device included in a function extension board of e.g., a server, otherwise stored in a memory device in a function extension unit connected to the plasma processing apparatus, based on instructions of the program codes, CPU and the like included in the function extension board or the function extension unit may execute the functions partially or entirely of the above-described preferred embodiments. This approach is also part of the present invention.

Further, although the rotational stability of the motor 15 is determined by comparing specific time spans in the above-mentioned preferred embodiments, abstract multiple control rules may be set, for example, in the same manner as in fuggy control, to thereby determine whether the rotation of the motor 15 is stable based on the multiple control rules.

Further, although the present invention is applied to the DRM type plasma processing apparatus in the above preferred embodiments, without being limited thereto, same may be applied to, e.g., a multi-pole plasma processing apparatus (see, e.g., Japanese Patent Laid-open Publication No. 2003-100716).

Further, although a substrate to be processed is a semiconductor wafer in the above preferred embodiments, without being limited thereto, a substrate may be a glass substrate such as LCD (Liquid Crystal Display) and FPD (Flat Panel Display).

While the invention has been shown and described with respect to the preferred embodiments, it will be understood by those skilled in the art that various changes and modifications may be without departing from the spirit and scope of the invention as defined in the following claims.

What is claimed is:

1. A plasma processing apparatus, comprising:
   a processing chamber for accommodating therein an object to be processed;
   a plurality of bar-shaped magnets rotatably installed standing around the processing chamber;

a rotation driving mechanism for synchronously rotating the bar-shaped magnets;

a rotation detection unit for detecting a rotation of a bar-shaped magnet and clocking times corresponding to the detected rotation and including a trigger sensor;

an abnormal rotation determination unit for determining whether the rotation driving mechanism is abnormal by comparing an interval calculated from the clocked times to a time period; and a plurality of trigger sensor pins each being joined to an inner peripheral surface of a gear coaxially disposed with one of the plurality of bar-shaped magnets, and where the trigger sensor detects the plurality of trigger sensor pins, wherein one end portion of each of the plurality of trigger sensor pins is projected upward from the gear.

2. The plasma processing apparatus of claim 1, comprising an abnormality notification unit for notifying, when the rotation driving mechanism is in an abnormal state, the abnormal state.

3. The plasma processing apparatus of claim 1, wherein the time period is a reference time corresponding to a specified number of rotations of the bar-shaped magnet and the abnormal rotation determination unit calculates an elapsed time required to complete the specified number of rotations to determine whether the rotation driving mechanism is abnormal by comparing the reference time to the calculated elapsed time.

4. The plasma processing apparatus of claim 3, wherein the abnormal rotation determination unit determines that the rotation driving mechanism is abnormal when an absolute value of the difference between the calculated elapsed time and the reference time is larger than an allowable value.

5. The plasma processing apparatus of claim 1, wherein the rotation detection unit clocks the times at specific timings as the bar-shaped magnet is rotated by a rotational angle.

6. The plasma processing apparatus of claim 5, comprising a time compensation unit for compensating a time presently clocked at a specific timing according to the difference between the time presently clocked at the specific timing and a time clocked at an immediately preceding timing of the specific timing.

7. The plasma processing apparatus of claim 5, wherein the abnormal rotation determination unit performs a statistical analysis of the times clocked at the specific timings to obtain a predicted time corresponding to a next specific timing based on a result of the statistical analysis and, further, determines whether the rotation driving mechanism is abnormal by comparing the predicted time to a time clocked at the next specific timing.

8. The plasma processing apparatus of claim 7, comprising a rotation control unit for controlling a rotation of the bar-shaped magnet based on the predicted time corresponding to the next specific timing.

9. The plasma processing apparatus of claim 1, comprising a rotational acceleration control unit for controlling rotational acceleration of the bar-shaped magnet.

10. The plasma processing apparatus of claim 1, comprising a rotation stop position control unit for detecting a rotation of the bar-shaped magnet to control a rotation stop position of the bar-shaped magnet.

11. The plasma processing apparatus of claim 10, wherein the rotation stop position control unit comprises:

a position sensor pin joined to the inner peripheral surface of the gear; and a position sensor for detecting the position sensor pin.

12. The plasma processing apparatus of claim 1, comprising a rotation control unit for controlling a rotation of the bar-shaped magnet according to a determination result when the rotation driving mechanism is determined to be abnormal.

13. The plasma processing apparatus of claim 1, comprising an operational record storage unit for storing an operational record of the plasma processing apparatus when the rotation driving mechanism is determined to be abnormal.

14. The plasma processing apparatus of claim 1, comprising a controller for controlling operations of components of the plasma processing apparatus based on operational states and state transitions, the operational states being defined as states of operations of the components in a plasma processing and the state transitions being defined as transitions between the operational states.

15. The plasma processing apparatus of claim 1, wherein each of said plurality of trigger pins is projected in a direction parallel to a rotational axis of the gear.

* * * * *